(12) United States Patent (10) Patent No.: US 9,169,157 B2
Srinivasan et al. (45) Date of Patent: Oct. 27, 2015

(54) FORMALDEHYDE FREE BINDER

(75) Inventors: Ramji Srinivasan, Alpharetta, GA (US);
Kurt D. Gabrielson, Lilburn, GA (US);
John B. Hines, Atlanta, GA (US);
Cornel Hagiopol, Lilburn, GA (US)

(73) Assignee: Georgia-Pacific Chemicals LLC, Atlanta, GA (US)

( * ) Notice: Subject to any disclaimer, the term of this patent is extended or adjusted under 35 U.S.C. 154(b) by 273 days.

(21) Appl. No.: 12/534,319

(22) Filed: Aug. 3, 2009

(65) Prior Publication Data

US 2010/0029160 A1 Feb. 4, 2010

Related U.S. Application Data

(63) Continuation-in-part of application No. 11/454,326, filed on Jun. 16, 2006, now Pat. No. 7,803,879, and a continuation-in-part of application No. 11/454,327, filed on Jun. 16, 2006, now Pat. No. 7,795,354.

(51) Int. Cl.
*C08F 222/08* (2006.01)
*C03C 25/26* (2006.01)
(Continued)

(52) U.S. Cl.
CPC . *C03C 25/26* (2013.01); *C08J 5/18* (2013.01); *C08K 5/053* (2013.01); *C08K 5/1545* (2013.01);
(Continued)

(58) Field of Classification Search
CPC ............ C08F 222/08; C08F 8/32; C08F 8/12; C08F 8/14; C08L 35/06; C08L 2201/54; C08L 2203/12; C08L 2666/34
See application file for complete search history.

(56) References Cited

U.S. PATENT DOCUMENTS 2,486,804 A 11/1949 Seymour et al.
3,245,933 A 4/1966 Muskat
(Continued)

FOREIGN PATENT DOCUMENTS

CA 2507776 A1 7/2004
DE 1745954 9/1971
(Continued)

OTHER PUBLICATIONS

Abstract of Adylova, K.M.; Akhmedov, U.K., Akhmedov, K.S., Synthesis of Water-Soluble Diphilic Polymers from Styrene-Maleic Anhydride Copolymer and Amino Alcohols, Doklady Akademii Nauk UzSSR, 1984, pp. 28-29, (12), Tashk. Politekh. Inst., Tashkent, USSR.
(Continued)

*Primary Examiner* — Richard A Huhn
(74) *Attorney, Agent, or Firm* — Ram W. Sabnis

(57) ABSTRACT

An aqueous binder composition, useful for making fiber products, especially fiberglass insulation, comprising an aqueous substantially alkaline (pH of at least 5.0) solution of a polyol and a hydrolyzed (solubilized) copolymer of maleic anhydride and a vinyl aromatic compound, preferably styrene (i.e., a SMA copolymer); the copolymer is solubilized using ammonia, an ammine, a primary alkanolamines (preferably monoethanolamine), a secondary alkanolamine (preferably diethanolamine (DEA)), a tertiary alkanolamine (preferably triethanolamine (TEA)), or a mixture thereof and the binder composition is cured as a consequence of cross-linking, esterification reactions between pendant carboxyls on the solubilized (hydrolyzed) copolymer (SMA) chains and hydroxyl groups of the polyol, including the diethanolamine and/or triethanolamine preferably used in the solubilization of the SMA.

20 Claims, 4 Drawing Sheets

(51) Int. Cl.

| | | |
|---|---|---|
| *C08K 5/053* | (2006.01) | |
| *C08K 5/1545* | (2006.01) | |
| *C08K 5/17* | (2006.01) | |
| *C09D 125/08* | (2006.01) | |
| *C09D 135/06* | (2006.01) | |
| *D04H 1/64* | (2012.01) | |
| *D04H 13/00* | (2006.01) | |
| *D06M 15/233* | (2006.01) | |
| *D06M 15/285* | (2006.01) | |
| *C08J 5/18* | (2006.01) | |
| *C08F 8/12* | (2006.01) | |
| *C08F 8/14* | (2006.01) | |
| *H05K 1/03* | (2006.01) | |

(52) U.S. Cl.
CPC .............. *C08K 5/17* (2013.01); *C09D 125/08* (2013.01); *C09D 135/06* (2013.01); *D04H 1/641* (2013.01); *D04H 13/008* (2013.01); *D06M 15/233* (2013.01); *D06M 15/285* (2013.01); *C08F 8/12* (2013.01); *C08F 8/14* (2013.01); *C08F 2810/20* (2013.01); *C08F 2810/50* (2013.01); *C08L 2201/54* (2013.01); *C08L 2203/12* (2013.01); *C08L 2312/00* (2013.01); *C08L 2666/34* (2013.01); *H05K 1/0366* (2013.01); *Y10T 442/60* (2015.04)

(56) References Cited

U.S. PATENT DOCUMENTS

| | | | |
|---|---|---|---|
| 3,297,657 A | | 1/1967 | Gray et al. |
| 3,715,233 A | | 2/1973 | Harrier |
| 3,880,811 A | | 4/1975 | Kaupp |
| 4,029,623 A | | 6/1977 | Maaghul |
| 4,032,690 A | | 6/1977 | Kohmura et al. |
| 4,054,713 A | | 10/1977 | Sakaguchi et al. |
| 4,220,752 A | | 9/1980 | Fink et al. |
| 4,330,444 A | | 5/1982 | Pollman |
| 4,477,496 A | | 10/1984 | Das et al. |
| 5,030,507 A | | 7/1991 | Mudge et al. |
| 5,047,452 A | | 9/1991 | Gicquel |
| 5,091,465 A | | 2/1992 | Dana et al. |
| 5,134,188 A | | 7/1992 | Blumm et al. |
| 5,198,492 A | | 3/1993 | Stack |
| 5,278,222 A | | 1/1994 | Stack |
| 5,318,990 A | | 6/1994 | Strauss |
| 5,340,868 A | | 8/1994 | Strauss et al. |
| 5,354,803 A | | 10/1994 | Dragner et al. |
| 5,362,842 A | | 11/1994 | Graves et al. |
| 5,389,716 A | | 2/1995 | Graves |
| 5,393,849 A | | 2/1995 | Srinivasan et al. |
| 5,498,658 A | | 3/1996 | Pourahmady et al. |
| 5,520,997 A | | 5/1996 | Pourahmady et al. |
| 5,661,213 A | * | 8/1997 | Arkens et al. .......... 524/555 |
| 5,670,585 A | | 9/1997 | Taylor et al. |
| 5,763,524 A | | 6/1998 | Arkens et al. |
| 5,919,873 A | | 7/1999 | Irving |
| 5,932,665 A | | 8/1999 | Deporter et al. |
| 5,932,689 A | | 8/1999 | Arkens et al. |
| 5,977,232 A | | 11/1999 | Arkens et al. |
| 6,039,821 A | | 3/2000 | Buck |
| 6,071,994 A | | 6/2000 | Hummerich et al. |
| 6,099,773 A | | 8/2000 | Reck et al. |
| 6,114,464 A | | 9/2000 | Reck et al. |
| 6,136,916 A | | 10/2000 | Arkens et al. |
| 6,171,654 B1 | | 1/2001 | Salsman et al. |
| 6,194,512 B1 | | 2/2001 | Chen et al. |
| 6,221,973 B1 | | 4/2001 | Arkens et al. |
| 6,299,936 B1 | | 10/2001 | Reck et al. |
| 6,331,350 B1 | | 12/2001 | Taylor et al. |
| 6,407,197 B1 | | 6/2002 | Van Den Berg et al. |
| 6,426,121 B1 | | 7/2002 | Goldstein et al. |
| 6,699,945 B1 | | 3/2004 | Chen et al. |
| 6,734,232 B2 | | 5/2004 | Hagiopol |
| 6,734,237 B1 | | 5/2004 | Taylor et al. |
| 6,803,439 B2 | | 10/2004 | Taylor |
| 7,067,579 B2 | | 6/2006 | Taylor et al. |
| 2001/0029280 A1 | | 10/2001 | Poth et al. |
| 2004/0033747 A1 | | 2/2004 | Miller et al. |
| 2004/0034154 A1 | | 2/2004 | Tutin et al. |
| 2004/0038017 A1 | | 2/2004 | Tutin et al. |
| 2004/0082240 A1 | | 4/2004 | Rodrigues |
| 2004/0082241 A1 | | 4/2004 | Rodrigues |
| 2004/0254285 A1 | | 12/2004 | Rodrigues et al. |
| 2005/0059770 A1 | | 3/2005 | Srinivasan et al. |
| 2005/0112374 A1 | | 5/2005 | Jaffee et al. |
| 2006/0231487 A1 | | 10/2006 | Bartley et al. |
| 2007/0292618 A1 | | 12/2007 | Srinivasan et al. |
| 2007/0292619 A1 | | 12/2007 | Srinivasan et al. |

FOREIGN PATENT DOCUMENTS

| | | |
|---|---|---|
| DE | 247456 A1 | 7/1987 |
| DE | 4342157 A1 | 6/1995 |
| EP | 0004053 A2 | 9/1979 |
| EP | 0353493 A1 | 2/1990 |
| EP | 0583086 A1 | 2/1994 |
| EP | 0990729 A1 | 4/2000 |
| EP | 1170265 A1 | 1/2002 |
| EP | 1770123 A1 | 4/2007 |
| FR | 2587024 A1 | 3/1987 |
| JP | 6-287276 A | 10/1994 |
| SU | 1073240 A | 2/1984 |
| WO | 95/30061 A1 | 11/1995 |
| WO | 9936368 A1 | 7/1999 |
| WO | 0105725 A1 | 1/2001 |
| WO | 0196460 A2 | 12/2001 |
| WO | 2005/035601 A1 | 4/2005 |

OTHER PUBLICATIONS

International Search Report for PCT/US03/17279 mailed Aug. 22, 2003, two pages, Alexandria, VA, USA.
International Search Report for PCT/US03/15399 mailed Dec. 29, 2003, three pages, Alexandria, VA, USA.
European Patent Office, Supplementary European Search Report for Application No. 03736789.3 dated Feb. 6, 2006, five pages, Rijswijk, Netherlands.
International Search Report and Written Opinion of the International Searching Authority for PCT/US2007/068317 mailed Nov. 8, 2007, nine pages, Rijswijk, Netherlands.
International Search Report and Written Opinion of the International Searching Authority for PCT/US2007/068226 mailed Nov. 21, 2007, 11 pages, Rijswijk, Netherlands.
Office Action for U.S. Appl. No. 11/454,326 mailed Jul. 8, 2009, ten pages, Alexandria, VA, USA.
Office Action for U.S. Appl. No. 11/454,327 mailed Jul. 9, 2009, nine pages, Alexandria, VA, USA.
Office Action response for U.S. Appl. No. 11/454,326, Nov. 6, 2009, 14 pages.
Office Action response for U.S. Appl. No. 11/454,327, Nov. 6, 2009, 13 pages.
Interview Summary for U.S. Appl. No. 11/454,326 mailed Nov. 10, 2009, three pages, Alexandria, VA, USA.
Interview Summary for U.S. Appl. No. 11/454,327 mailed Nov. 10, 2009, three pages, Alexandria, VA, USA.

* cited by examiner

FORMALDEHYDE FREE BINDER

CROSS-REFERENCE TO RELATED APPLICATIONS

This application claims the benefit of and incorporates by reference co-pending application Ser. No. 11/454,326 and 11/454,327 both filed Jun. 16, 2006.

FIELD OF THE INVENTION

The present invention relates to a formaldehyde-free binder composition, to the related method of its use for making fibrous products (including glass fiber products and especially fiberglass insulation), and to the fiber products themselves. The present invention specifically relates to an aqueous binder composition containing an aqueous substantially alkaline solution of a hydrolyzed copolymer of maleic anhydride and a vinyl aromatic compound such as styrene. The copolymer is solubilized using ammonia, a secondary alkanolamine (preferably diethanolamine (DEA)), a tertiary alkanolamine (preferably triethanolamine (TEA)), or a mixture thereof. The binder composition is cured as a consequence of cross-linking, esterification reactions between pendant carboxyls on the solubilized (hydrolyzed) copolymer chains and hydroxyl groups of a polyol, including diethanolamine and/or triethanolamine preferably used in the solubilization of the copolymer.

BACKGROUND OF THE INVENTION

Phenol-formaldehyde (PF) resins, as well as PF resins extended with urea (PFU resins), have been the mainstays of fiberglass insulation binder technology over the past several years. Such resins are inexpensive and provide the cured fiberglass insulation product with excellent physical properties.

One of the drawbacks of this technology, however, is the potential for formaldehyde emissions during the preparation of the adhesive resin, during the manufacturing of the fiberglass insulation and during its subsequent use.

Fiberglass insulation is typically made by spraying a dilute aqueous solution of the PF or PFU resin adhesive binder onto glass fibers, generally hot from being recently formed, forming a mat or blanket of the binder-treated fibers and then heating the mat or blanket to an elevated temperature in an oven to cure fully the adhesive resin.

Manufacturing facilities using PF and PFU resins as the main adhesive binder component for insulation products recently have had to invest in pollution abatement equipment to minimize the possible exposure of workers to formaldehyde emissions and to meet Maximum Achievable Control Technology (MACT) requirement Standards.

As an alternative to PF and PFU resins, certain formaldehyde free formulations have been developed for use as an adhesive binder for making fiberglass insulation products. One of the challenges to developing suitable alternatives, however, is to identify formulations that have physical properties (viscosity, dilutability, etc.) and other characteristics similar to the standard PF and PFU resins, i.e., formulations which also have a similar cure time/cure temperature profile, while yielding a cured fiberglass insulation product with equivalent physical properties.

U.S. Pat. No. 5,030,507 describes an emulsion copolymer binder for nonwoven products that is alleged to cure formaldehyde free. The copolymer is prepared by the emulsion polymerization of an (meth)acrylic acid ester, in combination with styrene, acrylonitrile or vinyl acetate, and both a hydroxy(meth)acrylate and an isocyanate.

U.S. Pat. Nos. 5,198,492 and 5,278,222 describe a latex binder for cellulose, said to be especially useful where low formaldehyde emissions are important. The binder is a combination of a non-formaldehyde emitting latex admixed with an aqueous copolymer dispersion of a highly functionalized emulsion copolymer. The functionalized emulsion copolymer is a low solids emulsion, i.e., 10 to 16% by weight of solids, made from 10 to 60% of an olefinically unsaturated non-ionic organic compound and equal parts of a carboxylic acid and an olefinically unsaturated carboxylic acid hydroxy ester, or an olefinically unsaturated amide, or a mixture thereof.

U.S. Pat. No. 5,318,990 describes a formaldehyde free formulation for fiberglass insulation based on an aqueous solution of a polymeric carboxylic acid, especially a polyacrylic acid, and a monomeric triol, such as glycerol, trimethylolpropane and the like. Other polyols may optionally be present. The formulation requires the presence of a phosphorus accelerator (catalyst) in the aqueous solution to obtain an effective cure at suitable temperatures.

U.S. Pat. No. 5,340,868 describes a binder for making a fiberglass mat comprising an aqueous solution of a polymeric carboxylic acid, such as polyacrylic acid, a β-hydroxyalkylamide and an at least tri-functional monomeric carboxylic acid, such as citric acid, trimellitic acid, hemimellitic acid, trimesic acid, tricarballylic acid, 1,2,3,4-butanetetracarboxylic acid (BTCA) and pyromellitic acid.

U.S. Pat. No. 5,354,803 describes a graft copolymer of a low molecular polyvinyl alcohol (PVOH) as a formaldehyde-free binder, having a vinyl or acrylic monomer grafted onto the PVOH through emulsion polymerization in the presence of free-radical generators. Suitable monomers include acrylic acid and maleic acid.

U.S. Pat. No. 5,393,849 describes a curable composition useful in making binder formulations made by combining an unsaturated polyester resin and a polyamino compound.

U.S. Pat. No. 5,498,658 (and the related divisional U.S. Pat. No. 5,520,997) describes a self-curing, formaldehyde-free interpolymer latex binder. The interpolymer is prepared principally by emulsion polymerization from the following monomers (1) an unsaturated monomer having a nucleophile group, (2) an unsaturated dicarboxylic acid, (3) (meth)acrylonitrile and optionally (4) a (meth)acrylic acid ester and (5) styrene. As described, the unsaturated monomer having a nucleophile group has a functional group, such as an amino or hydroxyl, which in combination with the dicarboxylic acid, allows the polymer to self-cross-link. Examples of such monomers are acrylamide and hydroxypropyl acrylate (see Examples 1, 2 and 3). Representative dicarboxylic acids include maleic acid and itaconic acid.

U.S. Pat. No. 5,661,213 (and the related U.S. Pat. No. 5,763,524; U.S. Pat. No. 6,136,916 and U.S. Pat. No. 6,221,973) describes a formaldehyde free formulation for fiberglass insulation based on an aqueous solution of a polyacid, such as a polyacrylic acid, and a polyol (at least a diol), with a molecular weight less than about 1000, such as, for example, ethylene glycol, glycerol, pentaerythritol, trimethylol propane, sorbitol, sucrose, glucose, resorcinol, catechol, pyrogallol, glycollated ureas, 1,4-cyclohexane diol, diethanolamine, triethanolamine, and certain reactive polyols such as, for example, β-hydroxyalkylamides. The carboxyl groups of the polyacid are neutralized to an extent of less than about 35% with a fixed base. The formulation generally requires the presence of a phosphorus accelerator (catalyst) in the aqueous solution to obtain an effective cure at suitable temperatures.

U.S. Pat. No. 5,932,689 describes a formaldehyde free formulation for fiberglass insulation based on a combination of three components (1) a polyacid, such as polyacrylic acid, (2) an active hydrogen-containing compound, such as a polyol, or a polyamine, and (3) a cyanamide, a dicyanamide or a cyanoguanidine. In this formulation, an accelerator (catalyst) is said to be optional. Suitable accelerators include a phosphorus or fluoroborate compound. As above, the carboxyl groups of the polyacid are neutralized to an extent of less than about 35% with a fixed base.

U.S. Pat. No. 5,977,232 describes a formaldehyde free formulation for fiberglass insulation based on a combination of three essential components (1) a polyacid, such as polyacrylic acid, (2) an active hydrogen-containing compound, such as a polyol, or a polyamine, and (3) a fluoroborate accelerator.

U.S. Pat. No. 6,071,994 describes a formaldehyde-free aqueous binder comprising (1) a free-radically polymerized polymer containing from 5 to 100% by weight of units derived either from an ethylenically unsaturated acid anhydride, or from an ethylenically unsaturated dicarboxylic acid whose carboxyl groups can form an anhydride group, and (2) an alkanolamine having at least two hydroxyl groups. Based on the specific examples polymers containing acrylic acid are preferred and all of the examples were formulated to cure at a pH of below 4.0.

U.S. Pat. No. 6,114,464 describes a binder for producing shaped articles, such as chipboard, comprising a curable composition of an addition polymer of an unsaturated mono- or dicarboxylic acid and a multi-hydroxyalkylated polyamine.

U.S. Pat. No. 6,171,654 describes preparing fiberglass insulation using a water soluble or water-dispersible curable polyester resin binder formed by reacting a polyol, such as pentaerythritol, a terephthalate polymer, such as recycled polyethylene terephthalate (PET), a polyacid, such as isophthalic and terephthalic acid, an end (mono-functional) acid, a reactive diluent (crosslinker) such as a melamine resin, and an acid catalyst.

U.S. Pat. No. 6,331,350 describes a binder formulation for fiberglass very similar to U.S. Pat. No. 5,661,213 except that the polyacid must have a low molecular weight and the pH of the aqueous solution must be adjusted to less than 3.5.

U.S. Pat. No. 6,426,121 describes dual cross-linkable emulsion polymers for use with nonwoven materials. The polymers "incorporate at least two different but reactive functionalities, i.e., hydroxy and carboxy." The polymer is formed by polymerizing ethylenically unsaturated carboxylic acids in the presence of PVOH. Hydroxyl functionality can be incorporated using hydroxy functional acrylates. The patent does not describe the polymer as self-cross-linking and suggests cross-linking by using a dual crosslinker system of a polyaldehyde and a polyaziridine.

U.S. Publications 2004/0033747; 2004/0082240 and 2004/0082241 describe aqueous binder compositions employing a copolymer having both hydroxyl and carboxyl functions that can be used to prepare non-woven mats, such as fiberglass insulation.

Despite these disclosures, there is a continuing need for identifying new formaldehyde-free, curable aqueous compositions suitable for use as a binder, specifically for fiberglass and especially for making glass fiber products such as fiberglass insulation.

Indeed, because most, if not all, of the prior art binder formulations employing polyacid-type polymer ingredients, such as a polyacrylic acid, are formulated at an acidic pH, a pH of below about 4.0 being typical, there is a heightened risk of incurring accelerated corrosion of process equipment associated with the storage, transport, and application of the binder compositions.

DETAILED DESCRIPTION OF THE INVENTION

Figure 1:
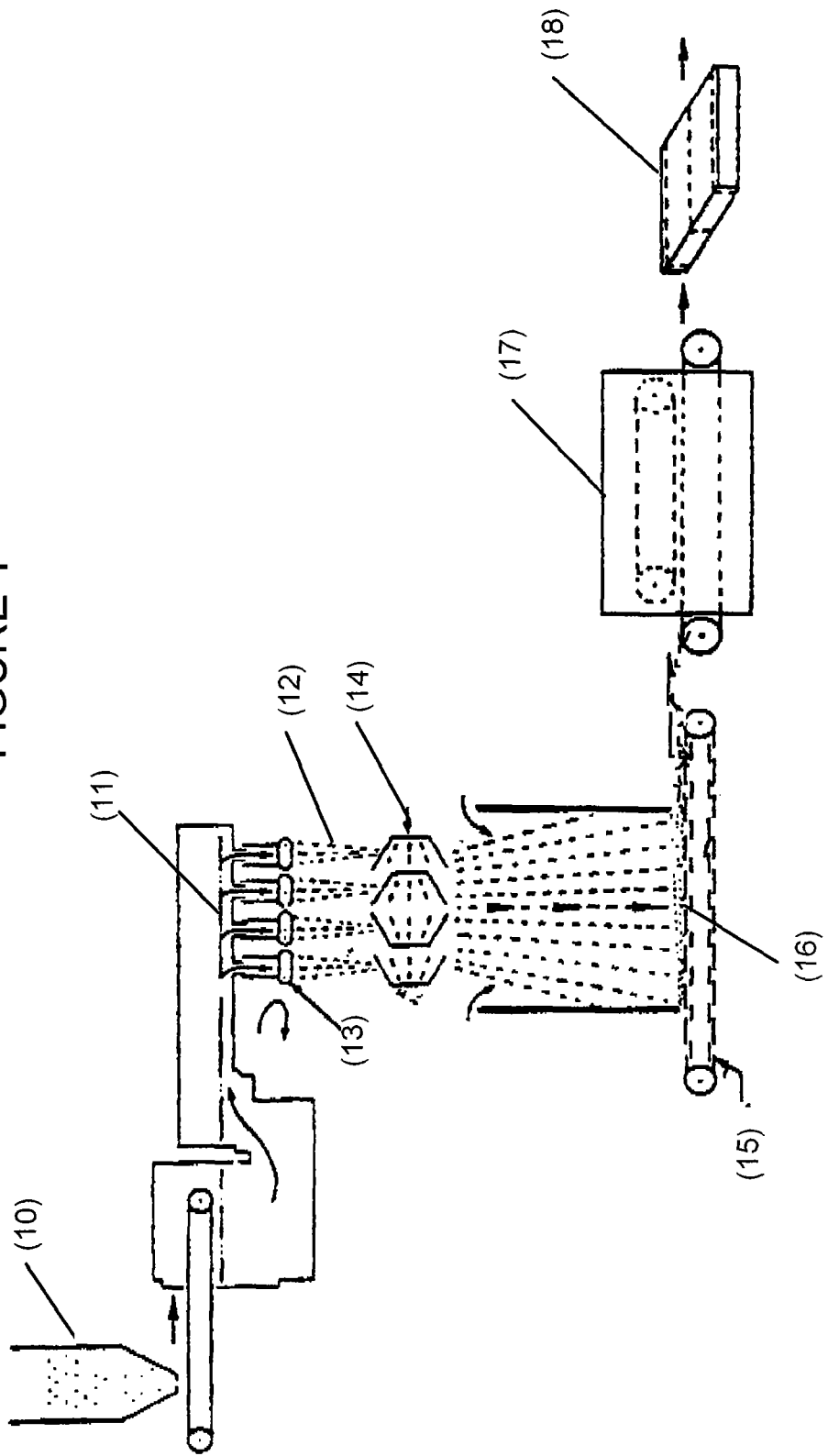
FIG. 1 schematically illustrates a method of making fiberglass insulation using the binder composition of the present invention.

The present invention is directed to a formaldehyde-free binder composition that can be formulated for use under substantially alkaline conditions, the related method of its use, such as for producing non-woven fiber products and the resulting products made with the cured (crosslinked) binder composition. One preferred application for using the binder composition is for making fiberglass insulation and related products, such as thin fiberglass mats (all hereinafter referred to generically as glass fiber products).

The present invention particularly relates to an aqueous, substantially alkaline (i.e., having a pH of about 5.0 and higher, such as a pH of 4.5 to 10.0) binder composition containing both a polyol and a hydrolyzed copolymer of maleic anhydride (or maleic acid) and a vinyl aromatic compound solubilized using an alkaline substance, such as a hydroxide, like sodium hydroxide, potassium hydroxide, ammonium hydroxide (e.g., aqueous ammonia), lithium hydroxide, or cesium hydroxide; a carbonate, like sodium carbonate, potassium carbonate or ammonium carbonate; ammonia or an amine (including primary, secondary and tertiary amines of alkanes, cycloalkanes and aromatics, polyamines like ethylenediamine and diethylenetriamine, and alkanolamines). Preferably, the copolymer of maleic anhydride (or maleic acid) and a vinyl aromatic compound is solubilized using ammonia, a secondary alkanolamine (preferably diethanolamine (DEA)), a tertiary alkanolamine (preferably triethanolamine (TEA)), or a mixture thereof. Preferably, the aqueous, substantially alkaline binder composition contains a hydrolyzed styrene-maleic anhydride (SMA) copolymer solubilized with ammonia, diethanolamine, triethanolamine or a mixture thereof. Solubilization with diethanolamine, triethanolamine or a mixture thereof is particularly preferred as these materials can also serve as at least a portion of the required polyol component of the composition.

Using well-known and widely available technology, maleic anhydride (and alternatively maleic acid) and a vinyl aromatic compound, preferably styrene, can be copolymerized, generally in a bulk process, using free radical initiators to yield a copolymer (in the case of a styrene-maleic anhydride (maleic acid) copolymer the material is commonly identified as SMA). Suitable SMA copolymers for practicing the present invention are commercially available from many sources, such that the details of SMA copolymerization procedures need not be described herein.

The fully formulated binder composition having a substantially alkaline pH, is applied as a dilute aqueous solution to a mat of non-woven fibers and can be cured by thermal energy, i.e., by heat. Curing (e.g., crosslinking) primarily takes place via an esterification reaction between pendant carboxyl groups of the hydrolyzed (preferably SMA) copolymer and hydroxyl groups of the polyol, including preferably diethanolamine and/or triethanolamine preferably used to solubilize the copolymer. Additional crosslinking may occur with additional polyols that may optionally be added to the formulation.

As used herein, "curing," "cured" and similar terms are intended to embrace the structural and/or morphological change which occurs in an aqueous binder composition of the present invention, such as by covalent chemical reaction (crosslinking), ionic interaction or clustering, improved adhesion to the substrate, phase transformation or inversion, and hydrogen bonding when the binder composition is dried and heated to cause the properties of a flexible, porous substrate, such as a mat or blanket of glass fibers, especially glass fibers, to which an effective amount of the substantially alkaline binder composition has been applied, to be altered.

The term "cured binder" means the cured product of the modified copolymer of maleic anhydride and a vinyl aromatic compound and any added polyol, which cured product bonds the fibers of a fibrous product together. Generally, the bonding occurs at the intersection of overlapping fibers.

By "formaldehyde-free" is meant that the composition is substantially free from formaldehyde, and does not liberate substantial formaldehyde as a result of drying and/or curing; typically, less than 1 ppm formaldehyde, based on the weight of the composition, is present in a formaldehyde-free composition. In order to minimize the formaldehyde content of the composition it is preferred to use additives that are themselves free from formaldehyde and do not generate formaldehyde during drying and/or curing.

As used herein, "aqueous" means water and mixtures composed substantially of water.

As used herein the terms "fiber," "fibrous" and the like are intended to embrace materials that have an elongated morphology exhibiting an aspect ratio (length to thickness) of greater than 100, generally greater than 500, and often greater than 1000. Indeed, an aspect ratio of over 10,000 is possible.

As used herein the phrase "heat resistant fibers" and the like are intended to embrace heat-resistant fibers suitable for withstanding elevated temperatures such as mineral fibers, aramid fibers, ceramic fibers, metal fibers, carbon fibers, polyimide fibers, certain polyester fibers, rayon fibers, and especially glass fibers. Such fibers are substantially unaffected by exposure to temperatures above about 120° C.

As used herein the phrase "substantially alkaline" and similar phrases means a pH of above about 5.0. The phrase "an alkaline pH" means a pH of above 7.0.

As used throughout the specification and claims, the terms "mat," "batt" and "blanket" are used somewhat interchangeably to embrace a variety of glass fiber substrates of a range of thicknesses and densities, made by entangling short fibers, long continuous fibers and mixtures thereof. Particularly preferred are mats, batts, or blankets made using heat resistant fibers.

The term "water dilutable" when used in connection with a binder composition means that water can be added to the binder composition in an amount of at least ten times the mass of the composition without causing solids to precipitate.

In a first aspect, the present invention is directed to a substantially alkaline, aqueous binder composition, preferably an alkaline binder composition, comprising, as its essential constituents, a hydrolyzed copolymer of maleic anhydride (maleic acid) and a vinyl aromatic compound (preferably the copolymer is an SMA copolymer) and a polyol. The copolymer is solubilized using an alkaline substance, such as a hydroxide, like sodium hydroxide, potassium hydroxide, ammonium hydroxide (e.g., aqueous ammonia), lithium hydroxide, or cesium hydroxide; a carbonate, like sodium carbonate, potassium carbonate or ammonium carbonate; ammonia or an amine (including primary, secondary and tertiary amines of alkanes, cycloalkanes and aromatics, polyamines like ethylenediamine and diethylenetriamine, and alkanolamines). Preferably, the copolymer is solubilized with ammonia, a secondary alkanolamine (preferably diethanolamine (DEA)), a tertiary alkanolamine (preferably triethanolamine (TEA)), or a mixture thereof. Preferably, DEA and/or TEA is used to solubilize the copolymer (preferably an SMA copolymer) and remains in the binder as at least a portion of the polyol for crosslinking the hydrolyzed, solubilized copolymer.

In another aspect, the present invention provides a method for binding together a loosely associated, non-woven mat or blanket of fibers, preferably heat resistant fibers, comprising (1) contacting said fibers with a curable, aqueous substantially alkaline binder composition (and preferably a curable, aqueous alkaline binder composition) containing a polyol and a hydrolyzed copolymer of maleic anhydride (maleic acid) and a vinyl aromatic compound (preferably an SMA copolymer) solubilized with an alkaline substance, preferably ammonia, a secondary alkanolamine (preferably diethanolamine (DEA)), a tertiary alkanolamine (preferably triethanolamine (TEA)), or a mixture thereof and (2) heating said curable binder composition to an elevated temperature, which temperature is sufficient to effect cure. Preferably, curing is effected at a temperature broadly within the range from 75° C. to 300° C. usually at a temperature between 100° C. and up to a temperature of about 250° C.

In yet another aspect, the present invention provides a fiber product, especially a glass fiber product such as a fiberglass insulation product, comprising a crosslinked (cured) binder composition obtained by curing a curable binder composition as defined above, applied to the fibers, preferably heat resistant fibers and particularly glass fibers, which are assembled into a non-woven mat or blanket.

The copolymer used to prepare the composition of the present invention is prepared from maleic anhydride (or maleic acid), i.e., MA monomer and a vinyl aromatic monomer. Suitable vinyl aromatic monomers are, for instance, styrene, alpha-methyl styrene and vinyl toluene. The copolymer (e.g., SMA copolymer) preferably contains styrene monomer as the vinyl aromatic monomer.

A copolymer containing vinyl aromatic monomer and MA monomer can be prepared using known processes and requires no description here. The copolymer (e.g., SMA) typically contains from 7 mole % to 50 mole % maleic anhydride (maleic acid) monomer and conversely from 50 mole % to 93 mole % vinyl aromatic monomer, preferably styrene monomer. More usually, the starting polymer contains from 20 mole % to 40 mole % maleic anhydride (maleic acid) monomer and conversely from 60 mole % to 80 mole % vinyl aromatic monomer, preferably styrene monomer. The molecular weight of the copolymer (e.g., SMA) may vary within wide limits. Preferably, the copolymer has a number-average molecular weight of between about 1000 and 300,000.

The copolymer (e.g., SMA) can contain a minor amount (less than 50 mole % and usually less than 30 mole % based on the amount of maleic anhydride (maleic acid)) of another unsaturated carboxylic acid monomer such as aconitic acid, itaconic acid, acrylic acid, methacrylic acid, crotonic acid, isocrotonic acid, citraconic acid, and fumaric acid and the mixtures thereof.

The copolymer also can contain a minor amount (less that 50 mole % and usually less than 30 mole %, based on the amount of the vinyl aromatic monomer such as styrene) of another hydrophobic vinyl monomer. A "hydrophobic vinyl monomer" is a monomer that typically produces, as a homopolymer, a polymer that is water-insoluble or capable of absorbing less than 10% by weight water. Suitable hydrophobic vinyl monomers within the broadest aspects of the present invention are exemplified by (i) vinyl esters of aliphatic acids such as vinyl acetate, vinyl propionate, vinyl butyrate, vinyl caproate, vinyl 2-ethylhexanoate, vinyl laurate, and vinyl stearate; (ii) diene monomers such as butadiene and isoprene; (iii) vinyl monomers and halogenated vinyl monomers such as ethylene, propylene, cyclohexene, vinyl chloride and vinylidene chloride; (iv) acrylates and alkyl acrylates, such as methyl acrylate, ethyl acrylate, n-propyl acrylate, isopropyl acrylate, n-butyl acrylate, isobutyl acrylate, tert-butyl acrylate, n-hexyl acrylate, cyclohexyl acrylate, and 2-ethylhexyl acrylate; (v) hydroxyacrylates and hydroxyalkylacrylates, such as hydroxyethylacrylate and hydroxymethylmethacrylate and (vi) nitrile monomers such as acrylonitrile and methacrylonitrile and mixtures thereof.

A preferred SMA copolymer for use in the binder composition of the present invention is one which is only soluble in water at a substantially alkaline pH and especially preferred are those SMA copolymers which are only soluble at an alkaline pH. Such copolymers can be prepared by the bulk, free radical polymerization of maleic anhydride (alternatively maleic acid) and styrene using well-known technology. Indeed, such SMA copolymers are commercially available from many sources. Due to the hydrophobic property of such SMA copolymers, they yield cured non-woven fiber products, such as glass fiber products, with superior wet tensile strength properties.

Commercial sources of suitable SMA copolymers for use in preparing the aqueous binder composition of the present inventions include Sartomer (with products such as SMA-1000, SMA-2000 and SMA-3000) and NOVA Chemicals (with the DYLARK line of specialty grade SMA products).

In accordance with the present invention, to prepare the binder composition the copolymer (e.g., SMA) is solubilized (hydrolyzed) with an alkaline substance, preferably ammonia, an amine, a primary alkanolamines (preferably monoethanolamine), a secondary alkanolamine (preferably diethanolamine (DEA)), a tertiary alkanolamine (preferably triethanolamine (TEA)), or a mixture thereof. Suitable secondary alkanolamines and tertiary alkanolamines include dimethyl ethanolamine, diethyl ethanolamine, ethyl diethanolamine, methyl diethanolamine, diethanolamine and triethanolamine. This solubilization can be accomplished by mixing the copolymer (e.g., SMA), which usually is supplied in flake or powder form, with the alkaline substance, preferably with aqueous ammonia, with a secondary alkanolamine (preferably with diethanolamine (DEA)), with a tertiary alkanolamine (preferably with triethanolamine (TEA)), or with a mixture thereof. The level of addition of any particular alkaline substance for obtaining a desired extent of copolymer solubilization is well within the normal skill in the art.

When using DEA and/or TEA for solubilizing the copolymer, the copolymer-DEA or copolymer-TEA or copolymer-DEA-TEA mixture is then diluted with water. Usually, the mixing of the copolymer with DEA, TEA or DEA-TEA mixture is done in an aqueous solution of DEA, TEA or a mixture thereof. Alternatively, initial mixing of the copolymer and the secondary alkanolamine, preferably DEA, and/or the tertiary alkanolamine, preferably TEA, can be accomplished in the absence of water (neat) with subsequent addition of water and optionally additional secondary alkanolamine and/or tertiary alkanolamine, e.g., DEA and/or TEA, as described in Example 5 hereinafter.

When using a secondary alkanolamine (preferably diethanolamine (DEA)), a tertiary alkanolamine (preferably triethanolamine (TEA)), or a mixture thereof for solubilizing the copolymer, the secondary alkanolamine (preferably diethanolamine (DEA)), the tertiary alkanolamine (preferably triethanolamine (TEA)), or a mixture thereof generally is provided in an amount relative to the copolymer (e.g., SMA), sufficient to provide at least 0.2 moles of amine per mole of MA monomer units in the copolymer. One should use less than one mole of alkanolamine per mole of MA monomer unit to be sure that there is sufficient free, residual carboxyl groups available for subsequent reaction (e.g., cure) and to avoid premature gelation of the binder. Usually, the secondary alkanolamine (preferably diethanolamine (DEA)), the tertiary alkanolamine (preferably triethanolamine (TEA)), or mixture thereof is provided in an amount relative to the SMA copolymer, sufficient to provide between about 0.2 moles to 0.8 moles of alkanolamine per mole of MA monomer units in the copolymer (e.g., SMA).

Usually, an aqueous solution of from 5 to 99% by weight secondary alkanolamine (preferably diethanolamine (DEA)), tertiary alkanolamine (preferably triethanolamine (TEA)), or a mixture thereof will be suitable for preparing the substantially alkaline aqueous solution of the solubilized (hydrolyzed) copolymer (e.g., SMA). To facilitate solubilization (hydrolysis), the mixing of the copolymer and preferably DEA and/or TEA is preferably done at a temperature between about 40 to 125° C. In order to minimize the amount of water that accompanies the binder composition during shipment and storage, it may in some case be preferable to use more concentrated solutions of secondary alkanolamine (preferably diethanolamine (DEA)), tertiary alkanolamine (preferably triethanolamine (TEA)), and their mixtures for solubilizing the copolymer. Thus, the solubilization solution will usually contain at least 25% and up to 99 weight % of the secondary alkanolamine (preferably diethanolamine (DEA)), the tertiary alkanolamine (preferably triethanolamine (TEA)), or a mixture thereof.

The preparation of the solubilized (hydrolyzed) copolymer is commonly conducted under an atmospheric pressure condition at a temperature in the range of about 50° C. to 100° C. Alternatively, the solubilization (hydrolization) can be conducted at an elevated (above atmospheric) pressure and at a temperature in the range of 100° C. to 150° C. Suitable conditions of temperature and pressure will be apparent to and easily accommodated by skilled workers.

It is preferred that the ultimate binder composition have at least a substantially alkaline pH, and it is more preferred that the pH of the binder composition actually be alkaline. As a result, in those instances where the pH of the hydrolyzed copolymer (e.g., SMA) is not sufficiently alkaline, the pH can be further increased by the addition of more base (alkaline substance). One preferred base for this pH adjustment purpose is ammonia, other bases including amines such as DEA and TEA also can be used for this purpose. For the most part, use of an inorganic base, such as alkali or an alkaline earth metal hydroxide, is less favored as these materials tend to reduce the hydrophobic character of the binder composition. Usually, ammonia in an amount of 1 to 10% by weight of the aqueous solution of solubilized copolymer (e.g., SMA) should be sufficient in most cases for this purpose.

As noted above, in addition to the solubilized copolymer, present as a substantially alkaline solution and preferably as an alkaline solution, the binder must also include a polyol. Preferably, at least a portion of the polyol is either, or both DEA and TEA optionally used to solubilize the copolymer. However, other polyols/crosslinkers that can be used in lieu or, or in addition to an alkanolamine in formulating the binder include monoethanolamine (MEA), ethylene glycol, diethylene glycol, triethylene glycol, polyethyleneoxide (hydroxy terminated), glycerine, pentaerythritol, trimethylol propane, sorbitol, a polysaccharide such as, sucrose, corn syrup, solubilized starch, or oxidized cornstarch and a monosaccharide such as fructose, or glucose (dextrose), polyvinyl alcohols, resorcinol, catechol, pyrogallol, glycollated ureas, and 1,4-cyclohexane diol to name a few.

In the broad practice of the present invention, the amount of polyol in the composition, whether or not supplied in whole or in part by DEA and/or TEA, should provide a mole ratio of —COOH contributed by copolymer component to —OH contributed by the polyol component (i.e., the —COOH:—OH) in the range of about 10:1 to 1:10, most often in the range of 5:1 to 1:5 and most usually in the range of 2:1 to 1:2. This mole ratio is conveniently determined by a ratio of the number of moles of the copolymer multiplied by its average functionality to the number of moles of the polyol component(s) multiplied by its average functionality. Such calculation is readily performed by skilled workers given the overall teachings of the present invention. Preferably, the mole ratio of —COOH to —OH is in the range of about 2:1 to about 1:2 and more preferably in the range of 1.5:1 to 1:1.5.

Again, it is preferred to use DEA and/or TEA as the principal polyol and in those instances where DEA and/or TEA is the principal polyol, it may nonetheless be desirable in some cases to include some amount (generally a small amount of less than 5 weight percent and often less than 1 weight percent) of an additional (optional) polyol as noted above. Other available additives for augmenting the cross-linking of the binder composition include urea and polyamino compounds, both synthetic and natural (e.g., protein sources such as soy).

As noted above, in the making of non-woven fiber products, and especially glass fiber products such as fiberglass insulation, the binder composition of the present invention is formulated into a dilute aqueous solution and then is usually applied, such as by spraying, onto the fibers, which in the case of fiberglass insulation manufacture are generally hot from having been freshly formed. Binder compositions containing somewhere between 1% by weight and 50% by weight solids are typically used for making non-woven fiber products, including glass fiber products.

The substantially alkaline aqueous solution (or aqueous alkaline solution) can be easily blended with other ingredients commonly used in the binder compositions for preparing non-woven fiber products and can be diluted with additional water to a low concentration applied onto the fibers, such as by spraying.

For example, to prepare a binder composition for making a non-woven glass fiber product, it may be advantageous to add a silane coupling agent (e.g., an organo silicon oil) to the binder composition in an amount of at least about 0.05 wt. % based on the weight of binder solids. Suitable silane coupling agents (organo silicon oils and fluids) have been marketed by the Dow-Corning Corporation, Petrarch Systems, and by the General Electric Company. Their formulation and manufacture are well known such that detailed description thereof need not be given. This invention is not directed to and thus is not limited to the use of any particular silane additives.

Fibrous mat manufacturers also normally add "dedusting" oil to minimize dust formation in the finished product. Such dedusting oils are usually high boiling point mineral oils. Owens-Corning also adds dye to the binder formulation to color the product pink. Other pigments, such as carbon black, also may be added. This invention is not directed to and thus is not limited to the use of any such additives or pigments.

A binder composition particularly useful for manufacturing glass fiber products may be prepared by combining the aqueous solution of the solubilized, hydrolyzed copolymer (e.g., SMA) and the silane coupling agent in a relatively easy mixing procedure carried out at ambient temperatures. The binder composition can be used immediately and may be diluted with water to a concentration suitable for the desired method of application, such as by spraying onto the glass fibers.

FIG. 1 schematically illustrates the manufacture of fiberglass insulation in a continuous process wherein molten glass flows from a melting furnace (10) is divided into streams (11) and is attenuated into fibers (12). The fiber attenuation generally is performed by centrifuging the molten glass though spinners (13) or by fluid jets (not shown) to form discontinuous glass fibers (12) of relatively small dimensions (and high aspect ratio). The predominant proportion of glass fibers used in the manufacture of fiberglass insulation has a diameter within the range from 0.5 to 20 μm and a length within the range from 0.5 to 10 cm.

A curable binder composition is generally formulated as a liquid and is applied usually by spraying (14) onto the hot glass fibers emerging from the fiber attenuation mechanism. The binder-treated fibers then are collected as they are randomly deposited on a moving foraminous conveyor belt (15). The dynamics of the binder application is such that much of the water in the binder is evaporated as the hot fibers are cooled by contact with the aqueous binder. The resin binder then becomes tacky holding the mass of fibers together as the resin begins to set. The fibers are collected on a conveyor belt (15) in a haphazard manner to form a non-woven mat (16). The depth (thickness) of the fibers forming the mat is determined by the speed of fiber formation and the speed of the conveyor belt (15). The fibrous product can be formed as a relatively thin product of about ⅛ to ¼ inch or it can be formed as a thick mat of 6 to 8 inches or even more. Depending on formation conditions, the density of the product also can be varied from a relatively fluffy low density product to a higher density of 6 to 10 pounds per cubic foot or higher, as is well understood by those skilled in the art.

The aqueous binder composition, after it is applied to the fibers, such as heat resistant fibers, is heated to effect final drying and curing. The duration and temperature of heating will affect the rate of processability and handleability, degree of curing and property development of the treated substrate. The curing temperatures are within the range from 50 to 300° C., preferably within the range from 90 to 230° C. and the curing time will usually be somewhere between 3 seconds to about 15 minutes.

On heating, any residual water present in the binder composition evaporates, and the composition undergoes curing. These processes can take place in succession or simultaneously. Curing in the present context is to be understood as meaning the chemical alteration of the composition, for example crosslinking through formation to covalent bonds between the various constituents of the composition, especially the esterification reaction between pendant carboxyl (—COOH) of the copolymer (e.g., SMA) and the hydroxyl (—OH) moieties of the polyol, preferably at least a portion of which is DEA and/or TEA, the formation of ionic interactions and clusters, and formation of hydrogen bonds.

As noted, the drying and curing functions may be effected in two or more distinct steps, if desired. For example, the composition may be first heated at a temperature and for a time sufficient to substantially dry but not to substantially cure the binder composition and then heated for a second time at a higher temperature and/or for a longer period of time to effect curing (cross-linking to a thermoset structure). Such a preliminary procedure, referred to as "B-staging", may be used to provide a binder-treated product, for example, in roll form, which may at a later stage be cured, with or without forming or molding into a particular configuration, concurrent with the curing process. This makes it possible, for example, to use the compositions of this invention for producing binder-impregnated semi-fabricates which can be molded and cured elsewhere.

The aqueous binder of the present invention can be satisfactorily cured with or without the assistance of any condensation accelerator, i.e., in the absence of any condensation accelerator, at conventional oven (cure) temperatures and in a commercially acceptable period of time for making non-woven fiber products.

Suitable condensation accelerators that optionally can be used in the binder composition for promoting the esterification reaction, i.e., the crosslinking reaction, between the carboxylic (—COOH) moieties of the hydrolyzed copolymer (e.g., SMA copolymer) and the hydroxyl (—OH) moieties of the alkanolamine preferably including MEA, DEA and/or TEA and any added polyol that leads to full cure, include inorganic acids, such as sulfuric acid, lead acetate, sodium acetate, calcium acetate, zinc acetate, organotin compounds, titanium esters, antimony trioxide, germanium salts, ammonium chloride, sodium hypophosphite, sodium phosphite and organic acids such as methane sulfonic acid and para toluene sulfonic acid. The phosphorus accelerators (catalysts) described in U.S. Pat. No. 5,661,213 can also be optionally employed, but are not necessary to obtain a complete cure at a commercially acceptable temperature and within a commercially acceptable time. Other condensation accelerators that could be used will be apparent to those skilled in the art and the present invention is not limited to any particular optional condensation accelerator. Indeed, the use of the binder composition of the present invention is usually employed in the absence of such accelerators.

When used, the condensation accelerator would generally be present in an amount of 10 wt. % or less, more usually 0.01 to 10 wt. %, even more typically 0.1 wt. % to 5 wt. %, and most often 0.5 wt. % to 2 wt. %, based on the weight of the copolymer. However, as noted above, one of the advantages of the binder composition of the present invention is that such condensation accelerators are not necessary for obtaining cure of the binder composition of the present invention under commercially acceptable conditions of temperature and time, usually from about 140 to 240° C. and under 15 minutes.

In making fiberglass insulation, the binder composition is usually applied to the hot glass fibers as they are being produced and formed into a mat or blanket. In operation, water is volatilized from the binder as it is applied onto the hot glass fibers, and the high-solids binder-coated fibrous glass mat then is heated to cure the binder fully and thereby produce a finished glass fiber product, e.g., a fiberglass insulation product. The binder composition is generally applied to the fibers in an amount such that the fully cured binder constitutes about 5 wt. % to about 15 wt. % of the finished fiber product, e.g., a fiberglass insulation product, although it can be as little as 1 wt. % or less and as high as 20 wt. % or more, depending upon the type of fiber product. Optimally, the amount of binder for most thermal insulation products will be the amount necessary to lock the fibers into an integral mass by bonding the fibers where they cross or overlap. For this reason, it is desired to have binder compositions with good flow characteristics, so that the binder solution can be applied to the fiber at a low volume that will flow to the fiber intersections.

As recognized by those skilled in the art and depending to some extent on the nature of the non-woven fiber product being produced, the binder composition may be applied to the fibers by one of a variety conventional techniques such as, for example, air or airless spraying, padding, saturating, roll coating, curtain coating, beater deposition, and coagulation. For example, when making thin mats of glass fibers, such as those used in making roofing shingles, the binder composition can be applied to the glass fibers by flooding a collected mat of glass fibers and draining off the excess, by applying the binder composition onto the glass fibers during mat formation, by spraying the glass fiber mat or the like. In using the binder composition in connection with a paper fiber product, passing the non-woven web through a saturating bath of the binder composition may be a useful method for applying the binder, as well as roll transfer application.

The particular method for forming fibers, including heat resistant fibers and especially glass fibers, for use in the present invention is not important. Continuous fibers also may be employed in the form of mats or blankets fabricated by swirling the endless filaments or strands of continuous fibers, or they may be chopped or cut to shorter lengths for mat or batt formation. Use can also be made of ultra-fine fibers formed by the attenuation of glass rods. Also, such fibers may be treated with a size, anchoring agent or other modifying agent before use or application of the binder.

Glass fiber insulation products may also contain fibers that are not in themselves heat-resistant such as, for example, certain polyester fibers, rayon fibers, nylon fibers, and super-absorbent fibers, in so far as they do not materially adversely affect the performance of the glass fiber product.

The fiber component will represent the principal material of the non-woven fiber products, such as a fiberglass insulation product. Usually 99-60 percent by weight of the product will be composed of the fibers, while the amount of binder solids will broadly be in reverse proportion usually ranging from 1-40 percent, depending upon the density and character of the product. Glass insulations having a density less than one pound per cubic foot may be formed with binders present in the lower range of concentrations while molded or compressed products having a density as high as 30-40 pounds per cubic foot can be fabricated of systems embodying the binder composition in the higher proportion of the described range.

Non-woven products and especially glass fiber products can be formed as a relatively thin product, such as a mat having a thickness of about 10 to 50 mils; or they can be formed as a relatively thick product, such as a blanket of 12 to 14 inches or more. Fiber products, including glass fiber products, of any thickness are embraced by the present invention. The time and temperature for cure for any particular non-woven fiber product will depend in part on the amount of binder in the final structure and the thickness and density of the structure that is formed and can be determined by one skilled in the art using only routine testing. For a structure having a thickness ranging from 10 mils to 1.5 inch, a cure time ranging from several seconds to 1-5 minutes usually will be sufficient at a cure temperature within the range of 1750-300° C.

Glass fiber products may be used for applications such as, for example, insulation batts or rolls, as reinforcing mat for roofing or flooring applications, as roving, as microglass-based substrate for printed circuit boards or battery separators, as filter stock, as tape stock, and as reinforcement scrim in cementitious and non-cementitious coatings for masonry. Still other uses will be readily apparent to those skilled in the art.

It will be understood that while the invention has been described in conjunction with specific embodiments thereof, the foregoing description and following examples are intended to illustrate, but not limit the scope of the invention. Other aspects, advantages and modifications will be apparent to those skilled in the art to which the invention pertains, and these aspects and modifications are within the scope of the invention.

EXAMPLE 1

To a pressure reactor (Parr) was added 1059 g of water, 223 g of SMA-2000 (Sartomer) (Styrene:MA mole ratio of approximately 2:1), 100 g of 40% by weight aqueous solution of diethanolamine (DEA), 68.5 g of a 28% by weight aqueous solution and 60 g of additional water. The reactor was then sealed and heated to about 105° C. where the internal pressure rose to about 10 psig. The content of the reactor was held at this condition under constant stirring until all of the SMA had dissolved and the solution reached a constant solid content (approximately 16%). The final pH of the aqueous solution was 9.5. The IR spectrum of the product showed the presence of both amide and carboxylate functionalities. The product was cured at 210° C. for 10 minutes. The IR spectrum of the cured product (210° C. for 10 minutes) showed the presence of amide, imide and ester functionalities.

EXAMPLE 2

To a standard resin kettle was added 200 g of SMA-1000 (Sartomer) (Styrene:MA mole ratio of 1:1), 62 g of DEA, and 786 g of water. The mixture was heated to about 98° C. for about 4-6 hours at which point all of the SMA had dissolved and the solution became clear. The sample, exhibiting a pH of about 4.3 to 4.5, then was split into two parts. The pH of each of the separate samples was then adjusted with aqueous ammonia (28% by weight) to pH 5.5 and 7.8 respectively. Both of these pH-adjusted samples showed excellent cure characteristics when heated in an aluminum pan at 210° C. for 15 minutes. The IR spectra of the resin solutions before curing showed the presence of a large concentration of carboxylate functionality, and only a trace amount of ester functionality. This IR spectrum indicates that the reaction of SMA with DEA under aqueous conditions is primarily a hydrolysis reaction where the anhydride is opened up by the DEA (acting as a base) and no significant esterification reaction occurs. The DEA is present as an ammonium carboxylate salt. The IR spectra of the cured sample showed the presence of both ester and amide functionalities indicating that crosslinking occurred by both ester and amide formation.

EXAMPLE 3

To a standard resin kettle was added 458 g of SMA-1000 (Sartomer) (Styrene:MA mole ratio of 1:1), water 1400 g and DEA 142 g. The mixture was processed in the same manner as in Example 2. The pH of the resin was adjusted, from an initial pH of about 4.4, to between 5.5-6.0 by the addition of 40 g of 28% by weight aqueous ammonia. The solids content of the aqueous resin solution was about 29.4% by weight. One small portion of the resin solution was adjusted to pH 8.0 by adding more aqueous ammonia. An IR spectrum of the solutions at these two pHs showed the presence of large amount of carboxylate moiety and only a trace amount of ester functionality in both of the samples. Both of these samples cured to an insoluble thermoset when heated for 10 minutes to a temperature of 210° C.

EXAMPLE 4

To a standard resin kettle were added 85 g of SMA-1000 (Sartomer) (having a styrene:MA mole ratio of 1:1), 590 g of water and 26 g of triethanolamine (TEA). The mixture was heated to about 98° C. for about 4-6 hours at which point all of the SMA had dissolved to form a milky white solution. The pH was then raised to 6.2 by the addition of 12 g of TEA and the solution became clear. The solids content of this solution was about 15.5 weight %. The resin was cured for 15 minutes. The IR spectra of the resin solution showed the presence of a large concentration of carboxylate functionality, and only a trace amount of ester functionality. The cured resin product showed the presence of ester and no amide, since TEA cannot form an amide link. This confirms that the any reaction of SMA with TEA under aqueous conditions will primarily be a hydrolysis reaction where the anhydride will be opened up by the TEA (base) and then held as an ammonium carboxylate salt.

EXAMPLE 5

To a standard resin kettle there was added 304 g of DEA and 50 g of SMA-1000 (Sartomer) (having a styrene:MA mole ratio of 1:1). The contents of the kettle were heated to 105° C. and held at that temperature for 1 hour at which time another 50 g of SMA were added. Following the addition of the second charge of SMA, the contents of the kettle were heated for another hour. The IR spectrum of the resin composition was taken before the addition of any water and showed the presence of both an ester and a carboxylic acid salt. There was not any signal for an amide. The IR spectrum indicates that the SMA can react with DEA in the absence of water to form an ester moiety with pendant secondary amine and hydroxyl functionality in the same polymer chain. The addition of 250 g of water into the kettle resulted in the complete dissolution of the resin due to the presence of secondary amine which forms a soluble carboxylate salt. To a 150 g portion of this solubilized resin was added 150 g of SMA and 600 g of water and the resulting mixture then was heated to 95° C. for about 2 hours at which time the mixture became cloudy. Adding 22 g of a 27% by weight aqueous ammonia solution produced a clear resin solution with a pH of 6.7. The IR spectrum of the clear solution product showed the presence of ester and carboxylic acid salt and only a trace amount of amide functionality. An IR spectrum of a cured portion of the resin solution showed a strong presence of both ester and amide functionalities. This IR spectrum indicates that the resin composition in which the styrene-maleic anhydride (SMA) co-polymer was modified with DEA in the absence of water produced a self-crosslinkable polymer having ester, amine, hydroxyl and carboxylic acid functionalities in the backbone. The amine and the carboxylic acid functionalities are present in the resin as ammonium carboxylate salts providing solubility to the polymer.

EXAMPLE 6

A High molecular weight SMA (MW>80,000 having a styrene:MA mole ratio of 3:1) solubilized with an aqueous ammonia (such products are sold by Georgia-Pacific as Novacote® 2000 and Novacote® 1936) were blended with triethanolamine (TEA), or glycerine to form binder compositions at pH's>7.0.

EXAMPLE 7

Tensile strengths (dry, wet and hot/wet) of hand sheets prepared using alkaline aqueous binder compositions of the type prepared in accordance with the foregoing examples were examined. The hand sheets were prepared by sprinkling the binder formulation onto a glass mat, formed from ½ inch PPG M-8035 chopped glass fibers dispersed in water containing a polyacrylamide dispersing agent, vacuuming the excess binder off the glass and then curing the so-formed sheet for 1 to 5 minutes in an oven that has been heated to a temperature of 200 to 240° C.

Dry tensile strengths of mats prepared using binder compositions described above were measured by subjecting samples of the hand sheets, 3 inches by 5 inches, prepared in the manner outlined above, to breaking using a tensile tester (QC-1000 Materials Tester by the Thwing Albert Instrument Co.).

Wet tensile strengths of mats prepared using these binder compositions were measured by soaking, for 10 minutes, 3 inch by 5 inch samples of the handsheets, prepared as outlined above, in water maintained at 25° C. These samples of hand sheets were then subjected to breaking using the same tensile tester (QC-1000 Materials Tester by the Thwing Albert Instrument Co.) while they were still wet.

Hot/wet tensile strength of mats prepared using these binder compositions were then measured by soaking the handsheets in 185° F. (85° C.) water for 10 minutes. Samples of the hand sheets (3 inches by 5 inches) were then subjected to breaking using the same tensile tester while they were still hot and wet.

EXAMPLE 8

Table 1 below reports tensile test results performed on hand sheets made with a standard phenol-formaldehyde (PF) resin (GP 2894) that is commercially available from Georgia-Pacific Resins, Inc. and conventionally used to make fiberglass insulation. The results using the conventional PF resin can be compared to the results obtained using the binder compositions of the invention (Example 3 and Example 4) and with a urea extended version of one of the binders as shown below in Table 1.

To produce a binder composition, 272.4 g of the resin solution of Example 3 (at about 29.4% solids) was mixed with 127.6 g of water to produce an insulation binder at 20% solids.

The resin solution of Example 4 (15.5% solids) was used directly as an insulation binder.

The urea-extended version of the Example 3 binder was prepared by mixing 238.4 g of the resin solution, 10 g of urea and 153 g of water to produce a binder having about 20% solids.

The tensile strength results (reported as pounds per linear inch) of the various samples are reported in Table 1. Average results are reported and were obtained by averaging the same number (at least 8) replicates for each comparison.

TABLE 1

| | Standard PF Resin Binder | Example 3 Binder | Example 4 Binder | Urea-Extended Example 3 Binder |
|---|---|---|---|---|
| Dry Tensile Strength | 85.2 | 78.3 | 68.4 | 74.6 |
| Wet Tensile Strength | 60.5 | 72.6 | 60.8 | 71.6 |
| Hot/Wet Tensile Strength | 47.5 | 70.3 | 48.9 | 61.9 |

The results presented above demonstrate that examples of the invention exhibit at least comparable and in the case of the DEA-solubilized SMA example, superior results to a commercial PF resin binder.

EXAMPLE 9

This example reports, in Table 2 below, tensile test results (reported as pounds per linear inch) performed on hand sheets made with a standard phenol-formaldehyde (PF) resin (GP 2894), commercially available from Georgia-Pacific Resins, Inc. and conventionally used to make fiberglass insulation and compares the results using the conventional PF resin with the results obtained using binder compositions prepared using resins of the type described in Example 6. Average results are reported and were obtained by averaging the same number (at least 8) replicates for each comparison.

TABLE 2

| | Standard PF Resin Binder | Novacote® 2000-TEA Binder | Novacote® 1936HS-TEA Binder | Novacote® 1936HS-Glycine Binder |
|---|---|---|---|---|
| Dry Tensile Strength | 54.7 | 65.6 | 81.9 | 55.8 |
| Wet Tensile Strength | 40.5 | 66.1 | 62.2 | 46.6 |
| Hot/Wet Tensile Strength | 26.8 | 51.1 | 40.1 | 34.0 |

EXAMPLE 10

To a standard resin kettle was added 600 parts by weight (pbw) of SMA-1000 ((Sartomer) a low molecular weight styrene-maleic anhydride copolymer with an approximately 1:1 mole ratio), 1000 pbw of water, and 40 pbw of MEA (monoethanolamine). An exothermic reaction occurred in the mixture. An IR taken of a sample of the reaction mixture after about 30 minutes of reaction time showed the presence of a secondary amide. At this point, 200 pbw of TEA (triethanolamine) then was added. The reaction mixture was heated to 90° C. for about 2 hours after which an additional 600 pbw of water was added and a clear solution was obtained. The pH of the aqueous resin was determined to be 4.7. The pH of the resin was then raised to above 7.0 by the addition of aqueous ammonia. The IR spectrum of this aqueous resin solution following such neutralization showed the presence of amide and a minor amount of imide and carboxylate salt. The so-produced resin product was heated to about 200° C. in an oven and showed good thermosetting characteristics. The IR spectrum of the cured thermoset resin showed the presence of ester, amide and imide groups. The resulting resin had a solids content of 37% by weight.

EXAMPLE 11

To a standard kettle was added 145.85 pbw TEA (triethanolamine) and 24.5 pbw of MEA (monoethanolamine), 105.52 pbw of SMA-1000 and 94.83 pbw of water. The reaction mixture exothermed to 36° C. After the exotherm had subsided, 541.9 pbw of anhydrous dextrose was added and the reaction mixture was warmed to 80° C. At this point, water (758.66 pbw) was added followed by an additional 254.55 pbw of SMA-1000. The reaction mixture was heated to 95° C. and was held until the reaction mixture had dissolved completely. During this process, the reaction mixture has changed color from light yellow to dark brown black. The resulting mixture had a pH of 5.8 which was increased to 7.0 by the addition of 25.4 pbw of an aqueous solution containing 28% by weight ammonia. The resulting resin had a final solids content of 47.02% by weight.

EXAMPLE 12

Comparison

A binder formulation was prepared for comparative purposes as follows: 228 pbw of anhydrous dextrose, 40 pbw of citric acid, 672 pbw of water and 60 pbw of an aqueous solution containing 28% by weight ammonia were mixed to give a clear binder solution of 20% by weight solids.

EXAMPLE 13

A binder solution was made by mixing 270 pbw of the product of Example 10, 100 pbw of anhydrous dextrose and 630 pbw of water.

EXAMPLE 14

Tensile strengths (dry, wet and hot/wet) of hand sheets prepared using alkaline aqueous binder compositions of the type prepared in accordance with the foregoing examples 10 through 13 were examined. The hand sheets were prepared by soaking the glass mat formed from ½ inch PPG M-8035 chopped glass fibers dispersed in water containing a polyacrylamide dispersing agent in a tray containing the binder and then vacuuming the excess binder off the glass. The so-formed handsheet was then cured for 1 to 5 minutes in an oven that has been heated to a temperature of 200 to 240° C.

Dry tensile strengths of mats prepared using binder compositions described above were measured by subjecting samples of the hand sheets, 3 inches by 5 inches, prepared in the manner outlined above, to breaking using a tensile tester (QC-1000 Materials Tester by the Thwing Albert Instrument Co.).

Wet tensile strengths of mats prepared using these binder compositions were measured by soaking, for 10 minutes, 3 inch by 5 inch samples of the handsheets, prepared as outlined above, in water maintained at 25° C. These samples of hand sheets were then subjected to breaking using the same tensile tester (QC-1000 Materials Tester by the Thwing Albert Instrument Co.) while they were still wet.

Hot/wet tensile strength of mats prepared using these binder compositions were then measured by soaking the handsheets in 185° F. (85° C.) water for 10 minutes. Samples of the hand sheets (3 inches by 5 inches) were then subjected to breaking using the same tensile tester while they were still hot and wet.

Figure 2:
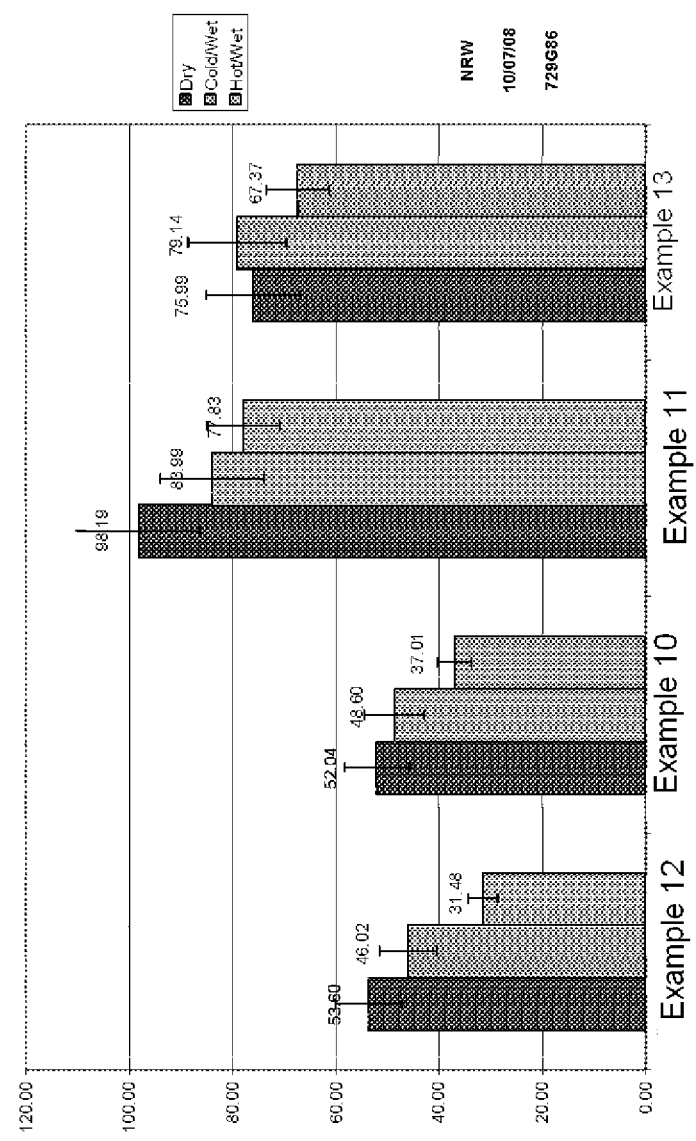
FIG. 2 presents dry, cold/wet and hot/wet tensile test results on hand sheets comparing the properties of hand sheets made with a comparison binder with the properties of hand sheets made with binders of the present invention.

The results of the tensile testing are graphically illustrated in FIG. 2. As shown, binders formulated with solubilized SMA using dextrose as a portion of the polyol showed superior performance.

EXAMPLE 15

Comparison

A binder prepared using a standard PF resin to be used for comparison was prepared as follows: to a commercially available phenol-formaldehyde resin (GP 558G880, in an amount of 440 pbw) was added 96 pbw of urea and 256 pbw of water. The mixture of ingredients was stirred for 6 hours at 25° C. To 720.13 pbw of this mixture was added 6.3 pbw of an aqueous solution containing 28% by weight ammonia, 660 pbw water and 112.8 pbw of ammonium sulfate.

EXAMPLE 16

To a pressure reactor (Parr) was added 1200 pbw of water, 400 pbw of SMA-1000 (Styrene:MA mole ratio of approximately 1:1), and 250 pbw of aqueous ammonia (28% by weight ammonia). The reactor was then sealed and heated to about 96° C. at which time the internal pressure had risen to about 5.0 psi. The contents of the reactor were held at this condition under constant stirring until all of the SMA had dissolved and the solution had reached a constant solids content (approximately 25% by weight). 480 pbw of this preparation was mixed with 130 pbw of dextrose monohydrate and 500 pbw of water to form a binder solution at 20% solids

EXAMPLE 17

A commercially available SMA product, GP-NovaCote® 2000, a high molecular weight SMA (MW>80,000; styrene/MA mole ratio 3:1 which is solubilized in ammonia) was blended with dextrose at about a 1:1 ratio by weight to form a binder compositions at a pH>7.0. (860 pbw of NovaCote 2000 @about 10% solids, 93 pbw of dextrose monohydrate and 590 pbw of water) to make a 15% solution.

EXAMPLE 18

Tensile strengths (dry and hot/wet) of hand sheets prepared using alkaline aqueous binder compositions of the type prepared in accordance with the foregoing examples 15 through 17 were examined. The hand sheets were prepared by soaking the glass mat, formed from ½ inch PPG M-8035 chopped glass fibers dispersed in water containing a polyacrylamide dispersing agent, in a tray containing the binder and then vacuuming the excess binder off the glass. The so-formed sheet was ten cured for 1 to 5 minutes in an oven that has been heated to a temperature of 200 to 240° C.

Dry tensile strengths of mats prepared using binder compositions described above were measured by subjecting samples of the hand sheets, 3 inches by 5 inches, prepared in the manner outlined above, to breaking using a tensile tester (QC-1000 Materials Tester by the Thwing Albert Instrument Co.).

Hot/wet tensile strength of mats prepared using these binder compositions were then measured by soaking the handsheets in 185° F. (85° C.) water for 10 minutes. Samples of the hand sheets (3 inches by 5 inches) were then subjected to breaking using the same tensile tester while they were still hot and wet.

Figure 3:
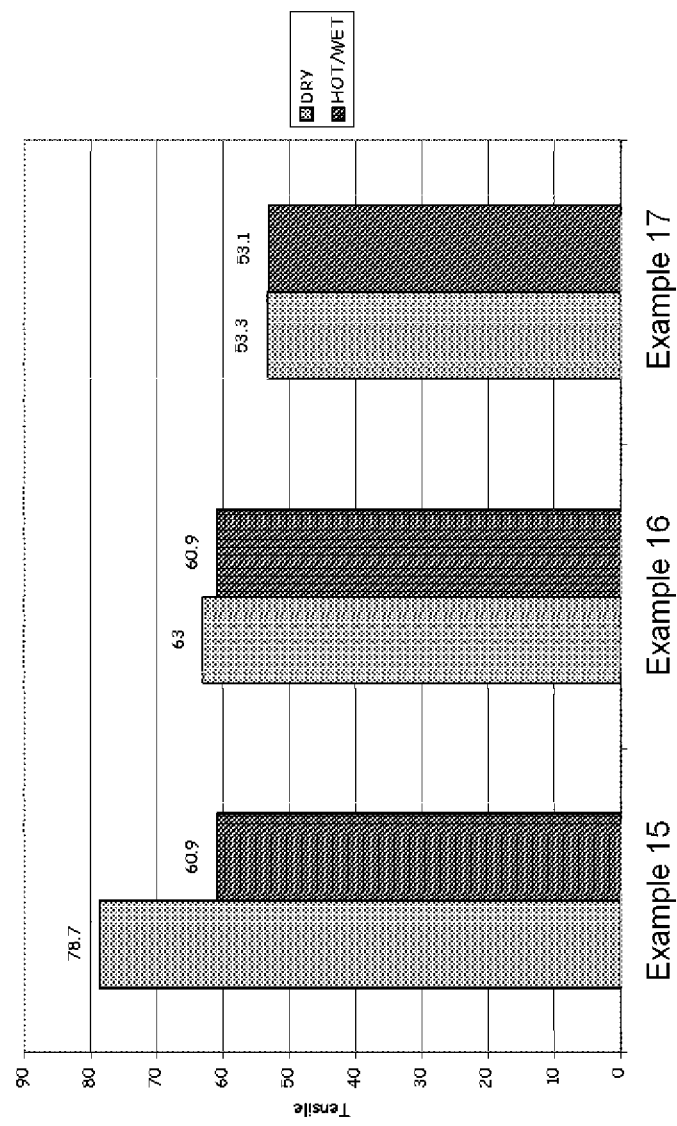
FIG. 3 presents dry and hot/wet tensile test results comparing hand sheets made with a standard thermally curable phenol-formaldehyde resin-containing binder with hand sheets made with binders of the present invention.

The results of the tensile testing are graphically illustrated in FIG. 3. As shown, binders formulated with solubilized SMA using dextrose as a portion of the polyol showed superior performance. Comparison of the tensile properties of mats prepared with binders formulated with ammonia-solubilized SMA using dextrose as a portion of the polyol also showed superior performance to mats made with the comparative binder of Example 12—compare FIGS. 2 and 3.

EXAMPLE: 19

Binder solution of example 13.

EXAMPLE 20

A binder composition was made by mixing 279 pbw of the resin of Example 10 at 43% by weight solids, with 130 pbw of dextrose monohydrate and 790 pbw of water

EXAMPLE 21

A binder composition was made by mixing 223 pbw of the resin of Example 10 at 43% by weight solids, with 156 pbw of dextrose monohydrate and 321 pbw of water.

EXAMPLE 22

Binder solution of Example 12

EXAMPLE 23

Tensile strengths (dry, wet and hot/wet) of hand sheets prepared using alkaline aqueous binder compositions of the type prepared in accordance with the foregoing examples 19 through 22 were examined. The hand sheets were prepared by soaking the glass mat, formed from ½ inch PPG M-8035 chopped glass fibers dispersed in water containing a polyacrylamide dispersing agent, in a tray containing the binder and then vacuuming the excess binder off the glass. The so-formed handsheet was then cured for 1 to 5 minutes in an oven that has been heated to a temperature of 200 to 240° C.

Dry tensile strengths of mats prepared using binder compositions described above were measured by subjecting samples of the hand sheets, 3 inches by 5 inches, prepared in the manner outlined above, to breaking using a tensile tester (QC-1000 Materials Tester by the Thwing Albert Instrument Co.).

Hot/wet tensile strength of mats prepared using these binder compositions were then measured by soaking the hand sheets in 185° F. (85° C.) water for 10 minutes. Samples of the hand sheets (3 inches by 5 inches) were then subjected to breaking using the same tensile tester while they were still hot and wet.

Figure 4:
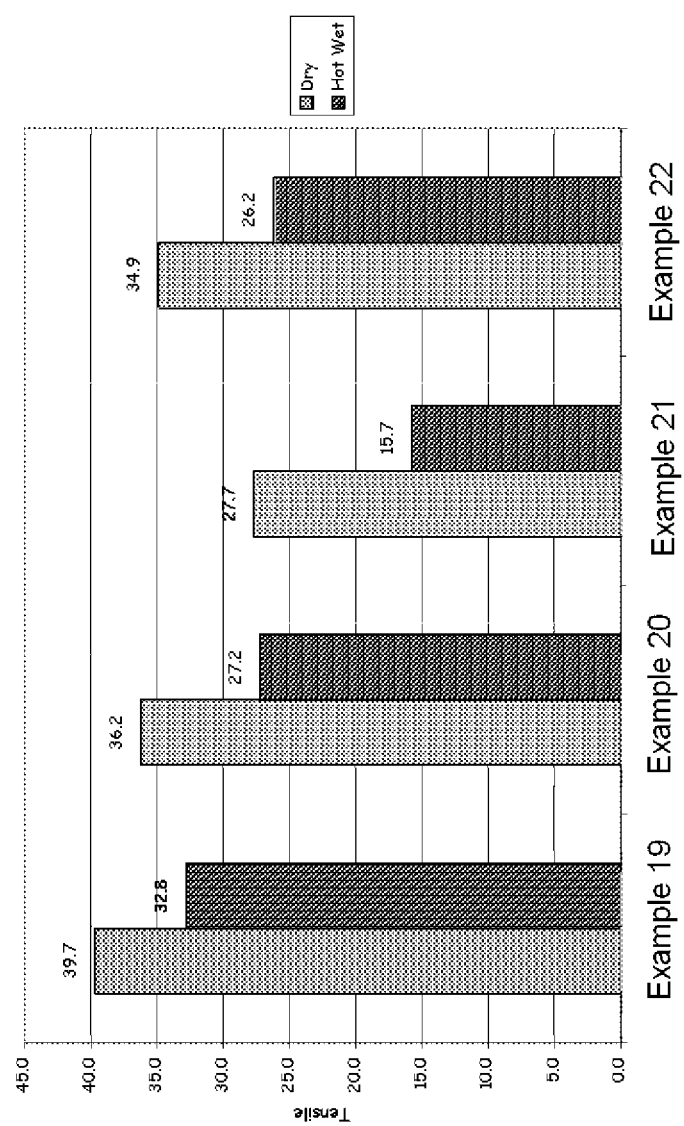
FIG. 4 presents dry and hot/wet tensile test results on hand sheets comparing the properties of hand sheets made with a comparison binder with the properties of hand sheets made with binders of the present invention.

The results of the tensile testing are graphically illustrated in FIG. 4. As shown, binders formulated with solubilized SMA using dextrose as a portion of the polyol showed acceptable performance.

The present invention has been described with reference to specific embodiments. However, this application is intended to cover those changes and substitutions that may be made by those skilled in the art without departing from the spirit and the scope of the invention. Unless otherwise specifically indicated, all percentages are by weight. Throughout the specification and in the claims the term "about" is intended to encompass + or −5%.

We claim as follows:

1. An aqueous binder composition comprising a polyol and an aqueous solution of a hydrolyzed copolymer of maleic anhydride and a vinyl aromatic compound, wherein:
the hydrolyzed copolymer is hydrolyzed using an alkaline substance comprising a primary alkanolamine and a tertiary alkanolamine,
the aqueous solution of the hydrolyzed copolymer has a pH above 7.0 and comprises an amide functional group,
the polyol comprises a monosaccharide, and
the aqueous binder composition is formaldehyde free.

2. The aqueous binder composition of claim 1, wherein the alkaline substance further comprises ammonia, one or more amines, or a mixture thereof.

3. The aqueous binder composition of claim 1, wherein the vinyl aromatic compound is styrene.

4. The aqueous binder composition of claim 1, wherein:
the hydrolyzed copolymer contains from 7 mole % to 50 mole % maleic anhydride and from 50 mole % to 93 mole % styrene,
the alkaline substance further comprises aqueous ammonia, and
the aqueous solution of the hydrolyzed copolymer comprises an imide functional group.

5. The aqueous binder composition of claim 4, wherein the hydrolyzed copolymer further contains an unsaturated carboxylic acid in an amount less than 30 mole %, based on the amount of maleic anhydride.

6. The aqueous binder composition of claim 5, wherein the unsaturated carboxylic acid is selected from the group consisting of: aconitic acid, itaconic acid, acrylic acid, methacrylic acid, crotonic acid, isocrotonic acid, citraconic acid, fumaric acid, lower alkyl esters thereof, and mixtures thereof.

7. The aqueous binder composition of claim 4, wherein the hydrolyzed copolymer further contains a non-styrenic vinyl compound in an amount less than 30 mole %, based on the amount of styrene.

8. The aqueous binder composition of claim 7, wherein the non-styrenic vinyl compound is selected from the group consisting of: vinyl acetate, vinyl propionate, vinyl butyrate, vinyl caproate, vinyl 2-ethylhexanoate, vinyl laurate, vinyl stearate, butadiene, isoprene, ethylene, propylene, cyclohexene, vinyl chloride, vinylidene chloride, methyl acrylate, ethyl acrylate, n-propyl acrylate, isopropyl acrylate, n-butyl acrylate, isobutyl acrylate, tert-butyl acrylate, n-hexyl acrylate, cyclohexyl acrylate, 2-ethylhexyl acrylate, acrylonitrile, methacrylonitrile, and mixtures thereof.

9. The aqueous binder composition of claim 1, wherein the hydrolyzed copolymer contains from 20 mole % to 40 mole % maleic anhydride and from 60 mole % to 80 mole % styrene.

10. The aqueous binder composition of claim 1, wherein the polyol further comprises diethanolamine, triethanolamine, ethyl diethanolamine, methyl diethanolamine, ethylene glycol, diethylene glycol, triethylene glycol, hydroxy terminated polyethyleneoxide, glycerine, pentaerythritol, trimethylol propane, sorbitol, a polysaccharide, polyvinyl alcohol, resorcinol, catechol, pyrogallol, glycollated ureas, 1,4-cyclohexane diol, or mixtures thereof.

11. The aqueous binder composition of claim 1, wherein the monosaccharide comprises glucose, fructose, or a mixture thereof.

12. The aqueous binder composition of claim 1, wherein the monosaccharide comprises glucose.

13. The aqueous binder composition of claim 1, wherein a molar ratio between pendant carboxyl (—COOH) groups of the copolymer and hydroxyl (—OH) groups of the polyol is from about 2:1 to about 1:2.

14. The aqueous binder composition of claim 1, wherein a molar ratio between pendant carboxyl (—COOH) groups of the copolymer and hydroxyl (—OH) groups of the polyol is from about 1.5:1 to about 1:1.5.

15. The aqueous binder composition of claim 1, wherein the aqueous solution of the hydrolyzed copolymer further comprises an imide functional group.

16. The aqueous binder composition of claim 1, wherein the primary alkanolamine comprises monethanolamine and the tertiary alkanolamine comprises triethanolamine.

17. The aqueous binder composition of claim 1, wherein the primary alkanolamine comprises monoethanolamine and the tertiary alkanolamine comprises triethanolamine, and wherein the polyol comprises glucose.

18. The aqueous binder composition of claim 1, wherein the primary alkanolamine comprises monoethanolamine and the tertiary alkanolamine comprises triethanolamine, wherein the hydrolyzed copolymer contains from 20 mole % to 40 mole % maleic anhydride and from 60 mole % to 80 mole % styrene, and wherein the monosaccharide comprises glucose.

19. The aqueous binder composition of claim 1, wherein the primary alkanolamine comprises monoethanolamine and the tertiary alkanolamine comprises triethanolamine, wherein a molar ratio between pendant carboxyl (—COOH) groups of the copolymer and hydroxyl (—OH) groups of the polyol is from about 1.5:1 to about 1:1.5, and wherein the monosaccharide comprises glucose.

20. The aqueous binder composition of claim 1, wherein the primary alkanolamine comprises monoethanolamine and the tertiary alkanolamine comprises triethanolamine, wherein the aqueous solution of the hydrolyzed copolymer further comprises an imide functional group, wherein a molar ratio between pendant carboxyl (—COOH) groups of the copolymer and hydroxyl (—OH) groups of the polyol is from about 1.5:1 to about 1:1.5, wherein the monosaccharide comprises glucose, and wherein the hydrolyzed copolymer contains from 20 mole % to 40 mole % maleic anhydride and from 60 mole % to 80 mole % styrene.

* * * * *